United States Patent
Jun et al.

(10) Patent No.: US 6,281,945 B1
(45) Date of Patent: Aug. 28, 2001

(54) VSB—DEPENDENT AUTOMATIC GAIN CONTROL

(75) Inventors: Jung Sig Jun, Seoul; Hee Bok Park, Kyungki-do, both of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/129,864

(22) Filed: Aug. 6, 1998

(30) Foreign Application Priority Data

Aug. 28, 1997 (KR) ................................................ 97-42187

(51) Int. Cl.[7] ...................................................... H04N 5/52
(52) U.S. Cl. ............................................ 348/678; 345/725
(58) Field of Search ..................................... 348/470, 678, 348/725, 554, 558; 325/345

(56) References Cited

U.S. PATENT DOCUMENTS 5,764,309 * 6/1998 Krishnamurthy et al. ............ 348/678

* cited by examiner

Primary Examiner—Victor R. Kostak

(57) ABSTRACT

A HDTV automatic gain control system includes a VSB mode detector and adjusts the gain according to the detected VSB mode to maximize the efficiency of the equalizer. Moreover, the HDTV automatic gain control system controls the input gain signal to be greater for the 16VSB mode than other modes.

7 Claims, 2 Drawing Sheets

VSB— DEPENDENT AUTOMATIC GAIN CONTROL

BACKGROUND OF INVENTION

The present invention relates to an automatic gain control system and more particularly to an automatic gain control system for a High Definition Television.

Currently, there are two ways to transmit data to a television (TV) receiver, the terrestrial transmission for the conventional TV and the cable transmission for Cable TV. Particularly, both the terrestrial and cable transmission use the vestigial sideband (VSB) modulation, by which the data is transmitted by multilevel symbols. The established standard data levels for the VSB signals are 2VSB with 2 symbol levels, 4VSB with 4 symbol levels, 8VSB with 8 symbol levels, and 16VSB with 16 symbol levels. The data level with the higher symbol levels can transmit greater data. However, as the data level increases, the number of symbols and the interspace between the symbols correspondingly decrease, resulting in a low signal to noise ratio (SNR). Particularly, the 16VSB with 16 symbol levels has the smallest interspace for each symbol and thus the lowest SNR.

The High Definition TV (HDTV) follows the suggested terrestrial and cable broadcasting standard using a VSB transmission of the 2, 4, 8, and 16 VSB. Accordingly, FIG. 1 shows a general block diagram of a HDTV incorporating an automatic gain control (AGC) system and FIG. 2 shows a block diagram of the AGC circuit.

Referring to FIG. 1, a HDTV automatic gain control system includes an antenna 10 receiving the transmitted signals; a tuner 12 tuning and converting the transmitted signal to an intermediate frequency (IF); an IF/carrier recoverer 14 converting the intermediate frequency to an analog-based signal, adjusting the gain factor according to the gain signal received, and outputting a gain control signal to the tuner 12; an A/D converter 16 converting the analog-based signal to a digital signal; and an AGC 18 determining the gain factor from the digital signal and outputting a gain control signal to the IF/carrier recoverer 14.

As shown in FIG. 2, the AGC 18 further includes an operator 180 taking the absolute value of the digitized signal and outputting the positive value, an adder 182 which sums the outputs from the operator 180 and the data level, an integrator 184 integrating the output of the adder 182, and a gain selector 186 which outputs a positive gain control signal if the integrator 184 outputs a negative value and outputs a negative gain control signal if the integrator 184 outputs a positive value. The adder 182 receives the positive signal value and assigns a negative polarity to the data level and outputs the summed value of the positive and the negative value.

In operation, the tuner 12 receives the input signal from the antenna 10 and converts the signal to an intermediate frequency. The IF/carrier recoverer 14 receives the intermediate frequency, converts the frequency signal to an analog-based signal, and outputs the analog-based signal to the A/D converter 16. The IF/carrier recoverer 14 also increases or decreases the gain according to the gain control signal from the AGC 18. The A/D converter 16 digitizes the analog based signal and outputs a digital signal to the AGC 18, wherein the absolute magnitude of the digital signal is taken and output to the adder 182.

In the signal transmission for a HDTV, every data line includes a segment synchronization (sync) signal in the first four symbols and the segment sync signal carries the designated data level with respect to the VSB mode. The adder 182 assigns a negative value to the designated data level and sums the positive digital signal value received from the operator 180 and the negative data level value of the segment sync signal. The integrator 184 receives the summed value from the adder 182, continually integrates the summed value, and outputs the integrated value to the gain selector 186.

If the integrated value is negative, the current gain on the signal transmission is determined to be lower than the data level and the gain selector 186 outputs a positive gain control signal to the IF/carrier recoverer 14. On the other hand, if the integrated signal value is positive, the current gain on the signal transmission is determined to be higher than the data level and the gain selector 186 outputs a negative gain control signal to the IF/carrier recoverer 14. The IF/carrier recoverer 14 receives either the positive or negative gain control signal from the gain selector 186 and accordingly adjusts the intermediate frequency. However, the IF/carrier recoverer has a predetermined range for adjusting the intermediate frequency and if the range were to be surpassed by the necessary adjustment, the control of the gain on the intermediate signal is transmitted back to the tuner 12.

Thus the gain of the analog based signal is converted by A/D converter 16 to a digital signal and the digitized signal level can be adjusted to the correct data level through the AGC 18. Up to now however, the automatic gain control system was directed to simply correct the data level without taking into consideration the number of symbol levels. Accordingly, the signal to noise ratio (SNR) suffers when the number of symbol levels increases because the interspace between each symbol level must necessarily decrease. One way to solve this problem is to use greater transmission power to maintain channel signal separations when the number of symbol levels increase. However, higher transmission power requires a greater cost.

OBJECTIVES OF THE INVENTION

An object of the present invention is to solve at least the problems and disadvantages of the related art.

Particularly, an object of the present invention is to minimize the SNR, especially for the 16VSB mode.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, the HDTV automatic gain control system according to the present invention includes a VSB mode detector and outputs the gain control signal according to the detected VSB mode.

BRIEF DESCRIPTION OF THE DRAWING

The invention will be described in detail with reference to the following drawings in which like reference numerals refer to like elements wherein.

DETAILED DESCRIPTION OF THE INVENTION

The preferred embodiment of the automatic gain control system according to the present invention further includes detecting the VSB mode from the digitized signal, and outputting the gain increase/decrease signal according to the detected VSB mode. Also, when the detected VSB mode is 16VSB, the HDTV automatic gain control system increases the gain to the output digital signal of the A/D converter by outputting a positive control gain signal to the carrier recovery.

Figure 1:
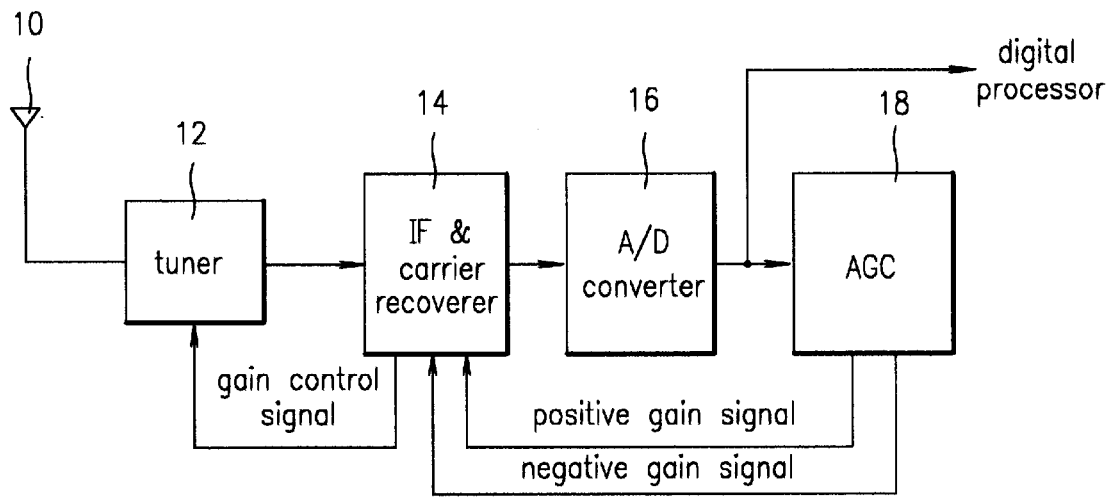
FIG. 1 is a block diagram of a HDTV automatic gain control system.
Figure 2:
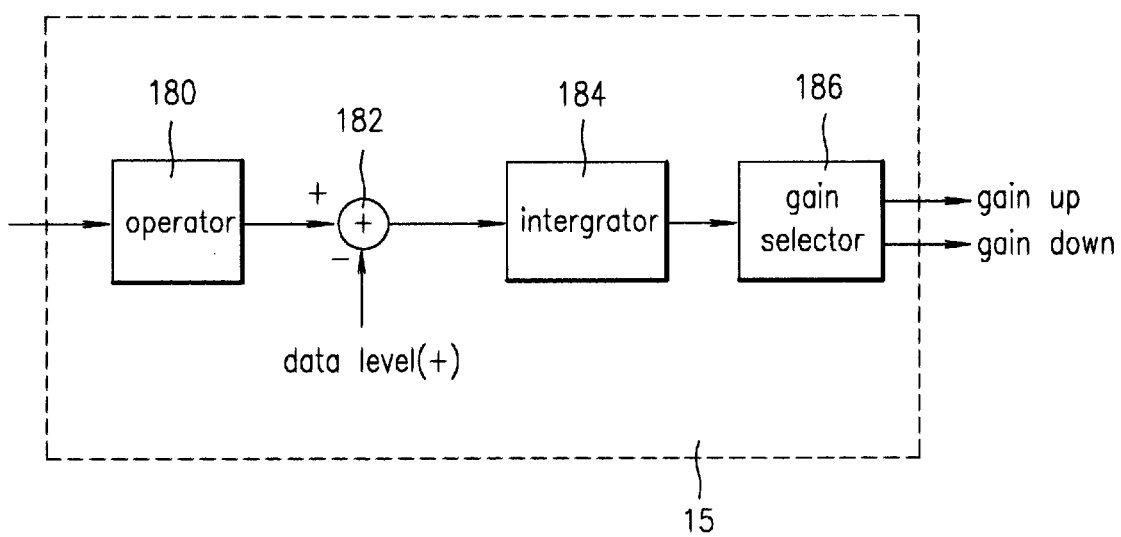
FIG. 2 is a block diagram of an AGC.
Figure 3:
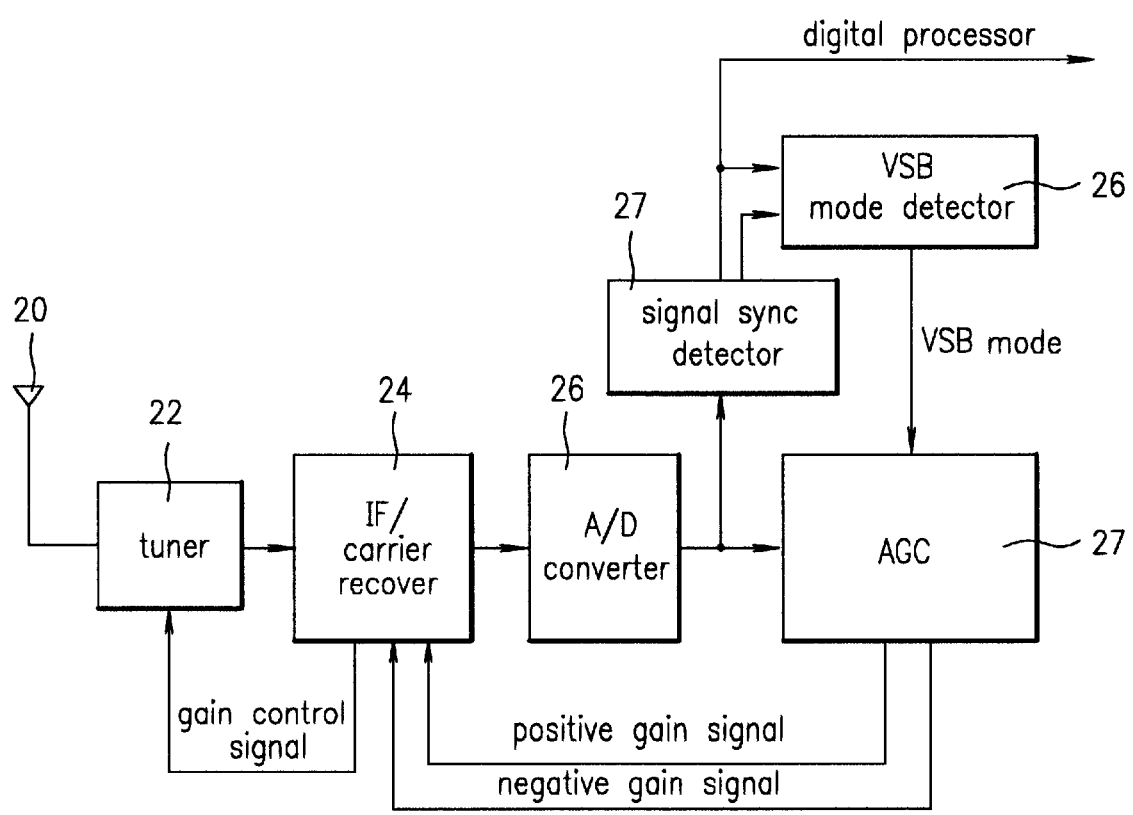
FIG. 3 is a block diagram of a HDTV automatic gain control system incorporating the present invention.

FIG. 3 shows a preferred embodiment of the present invention including a tuner 22, an IF/carrier recoverer 24, an A/D converter 26, a sync signal detector 27 detecting the segment and field sync signal of the digital signal received from the A/D converter 26, a VSB mode detector 29 detecting the VSB mode using the segment and field sync detected, an AGC 28 for adjusting the margin of the A/D converter 26 output according to the VSB mode detected and outputting a control gain increase/decrease signal to the IF/carrier recoverer 24. The tuner 22, the If/carrier recoverer 24, and the A/D converter 26 operates in the same manner as the corresponding elements described with reference to FIG. 1.

As discussed above, the standard VSB data levels for a HDTV broadcasting are 2, 4, 8 and 16 VSB. However, the 8VSB mode has been the standard VSB mode for the terrestrial broadcasting while the 2, 4, and 16 VSB modes have been reserved for the cable TV broadcasting. Also, during the first stages of HDTV broadcasting, NTSC, the pre-established TV broadcasting which carries the designated VSB mode is transmitted.

Depending on the designated VSB mode, the A/D converter 26 has a predetermined converting range depending on the number of bits utilized. However, to maximize the efficiency of the channel equalizer (not drawn) at the digital processor, the A/D converter 26 must leave an error margin within the predetermined converting range. Because ghost signals may increase the amplitude of the input signal, the error margin insures that the input signal remains within the converting range. Thus the actual converting range must be larger than the predetermined range in order to compensate for the error margin For the 8VSB mode, the error margin must be at least 9 dB to increase the SNR and to maximize the efficiency of the equalizer. Accordingly, if the A/D converter leaves a margin of 9 dB in the predetermined converting range for the 8VSB mode, the same margin of 9 dB is set for the predetermined converting range of the 16VSB mode. Thus, the utilization of the converting range for the 16VSB with 16 symbol levels would be reduced by 9 dB and significantly reduce the interspace between the symbol levels. As a result, setting the error margin of 9 dB to satisfy the SNR for an 8VSB mode, reduces the SNR for the 16VSB mode.

However, the 16VSB mode is for cable transmission and the distortion on the cable channel is minimal compared to a TV channel. Accordingly, with an error margin of only 6 dB, the 16VSB mode can maximize the SNR of the A/D converter output data without decreasing the efficiency of the channel equalizer.

Thus, the signal sync detector 27 first detects the segment sync signal, then the field sync signal from the digital signal output of the A/D converter 26. Afterwards, the VSB mode detector 29 detects the VSB mode from a fixed location within the field sync signal and outputs the detected VSB mode to the AGC 28. If the VSB mode is 8VSB, the AGC 28 will set an error margin of 9 dB for the converting range of the A/D converter 26. Using the segment sync signal, the AGC 28 outputs a gain increase/decrease signal to the IF/carrier recoverer 24 such that the error margin becomes 9 dB for the data level output of the A/D converter 26. The AGC 28 controls the gain of the 8VSB mode for the TV and the 2, 4, 8 VSB modes for cable TV in the manner as explained above.

If the detected VSB mode is 16VSB for cable TV, the AGC 28 outputs a gain increase signal larger than for the 2, 4, 8 VSB modes to the IF/carrier recoverer 24 such that the input analog based signal to the A/D converter 26 has an error margin of 6 dB. Thus, the number of bits used to establish the converting range may be decreased since smaller error margin is required.

In sum, the present HDTV automatic gain control system controls the input gain signal for the A/D converter 24 to be greater for the 16VSB mode than the other modes. By controlling the gain signal for the 16VSB mode, the present invention minimizes the number of bits required for the A/D converter accordingly.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A digital TV signal receiver comprising:

a processor receiving the input signal, said processor converting the signal to a digital signal and outputting the digital signal;

a detecting circuit coupled to said processor to receive the digital signal and detect the VSB mode of the digital signal; and a control circuit, coupled to said processor and said detecting circuit, to adjust the digital signal output of said processor according to the detected VSB mode such that the digital signal output is set to one of only two first and second levels, the first level being set if the detected VSB mode is 16VSB and the same second level being set if said detected VSB mode is one of 2VSB, 4VSB and 8VSB, wherein said first level is greater than said second level.

2. A receiver of claim 1, wherein said processor comprising:

a tuner receiving the input signal, said tuner converting the signal to an intermediate frequency and outputting the intermediate frequency;

a recoverer coupled to said tuner to receive said intermediate frequency, said recoverer converting the intermediate frequency to an analog signal and outputting the analog signal; and a converter coupled to said recoverer to receiver the analog signal, said converter digitizing the analog signal and outputting the digital signal.

3. A receiver of claim 2, said control circuit comprising:

an operator coupled to said converter to receive the digital signal, said operator taking the absolute value of the digital signal and outputting the magnitude of the digital signal;

an adder coupled to said operator and said detecting circuit, said adder assigning opposite polarities to the data level according to the detected VSB mode and to the magnitude of the digital signal output by said operator; said adder outputting the sum of the average and the magnitude;

an integrator coupled to said adder to receive the summed value, said integrator continually integrates the summed value and outputs the integrated value; and a gain selector coupled to said integrator to receive the integrated value, said gain selector outputting a positive gain control if the integrated value meets a first prescribed condition and outputting a negative gain control if the integrated value meets a second prescribed condition.

4. A circuit of claim 3, said detecting circuit comprises a sync detector for detecting the segment sync signal and the field sync signal; and a VSB mode detector coupled to said sync detector and detecting the VSB mode using the detected segment and field sync signals.

5. A digital TV signal receiver comprising:

a processor receiving the input signal, said processor converting the signal to a digital signal and outputting the digital signal;

a detecting circuit coupled to said processor to receive the digital signal and detecting the VSB mode of the digital signal; and a control circuit coupled to said processor and said detecting circuit, said control circuit adjusting the digital signal output of said processor to one of only two first and second levels, the first level being set if the detected VSB mode is 16VSB and the same second level being set if said detected VSB mode is one of 2VSB, 4VSB and 8VSB, wherein said first level is greater than said second level.

6. A digital TV signal receiver comprising:

a processor receiving the input signal, said processor converting the signal to a digital signal and outputting the digital signal;

a detecting circuit coupled to said processor to receive the digital signal and detecting the VSB mode of the digital signal; and a control circuit, coupled to said processor and said detecting circuit, to adjust the digital signal output of said processor according to the detected VSB mode such that the digital signal output is set to one of only two first and second levels, the first level being set if the detected VSB mode is 16VSB and to the same second level being set if said detected VSB mode is one of 2VSB, 4VSB and 8VSB, wherein said first level is greater than said second level;

wherein said detecting circuit comprises a sync detector for detecting the segment sync signal and the field sync signal, and a VSB mode detector coupled to said sync detector for detecting the VSB mode using the detected segment and field sync signals.

7. A method for receiving TV signals comprising:

receiving the input signal;

converting the signal to a digital signal and outputting the digital signal;

receiving the digital signal and detecting the VSB mode of the digital signal; and adjusting the digital signal output according to the detected VSB mode such that the digital signal output is set to one of only two first and second levels, the first level being set if the detected VSB mode is 16VSB and the same second level being set if said detected VSB mode is one of 2VSB, 4VSB and 8VSB, wherein said first level is greater than said second level.

* * * * *